US010324375B2

(12) United States Patent
Iwashita et al.

(10) Patent No.: US 10,324,375 B2
(45) Date of Patent: Jun. 18, 2019

(54) PHOTOSENSITIVE RESIN COMPOSITION, PHOTOSENSITIVE FILM, AND METHOD FOR FORMING RESIST PATTERN

(71) Applicant: HITACHI CHEMICAL COMPANY, LTD., Tokyo (JP)

(72) Inventors: Kenichi Iwashita, Hitachi (JP); Yasuharu Murakami, Hitashi (JP); Hanako Yori, Tsukuba (JP); Tetsuya Kato, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/655,087

(22) PCT Filed: Nov. 5, 2013

(86) PCT No.: PCT/JP2013/079927
§ 371 (c)(1),
(2) Date: Jun. 24, 2015

(87) PCT Pub. No.: WO2014/103516
PCT Pub. Date: Jul. 3, 2014

(65) Prior Publication Data
US 2015/0323867 A1 Nov. 12, 2015

(30) Foreign Application Priority Data
Dec. 27, 2012 (JP) ................ 2012-285089

(51) Int. Cl.
| G03F 7/16 | (2006.01) |
| G03F 7/20 | (2006.01) |
| G03F 7/32 | (2006.01) |
| G03F 7/38 | (2006.01) |
| G03F 7/40 | (2006.01) |
| H05K 1/03 | (2006.01) |
| H05K 3/28 | (2006.01) |
| H05K 3/46 | (2006.01) |
| G03F 7/038 | (2006.01) |
| H01L 21/02 | (2006.01) |
| H01L 21/311 | (2006.01) |
| C08G 59/24 | (2006.01) |
| C08G 59/62 | (2006.01) |
| C08G 59/68 | (2006.01) |
| C08L 63/00 | (2006.01) |
| C09D 163/00 | (2006.01) |
| C08K 5/375 | (2006.01) |
| C08L 61/04 | (2006.01) |
| C08L 61/06 | (2006.01) |

(52) U.S. Cl.
CPC ........... *G03F 7/0385* (2013.01); *C08G 59/24* (2013.01); *C08G 59/621* (2013.01); *C08G 59/68* (2013.01); *C08L 63/00* (2013.01); *C09D 163/00* (2013.01); *G03F 7/038* (2013.01); *G03F 7/16* (2013.01); *G03F 7/20* (2013.01); *G03F 7/322* (2013.01); *G03F 7/38* (2013.01); *G03F 7/40* (2013.01); *H01L 21/02118* (2013.01); *H01L 21/311* (2013.01); *H05K 3/287* (2013.01); *H05K 3/4661* (2013.01); *H05K 1/0353* (2013.01)

(58) Field of Classification Search
CPC ...... C08G 59/68; C08G 59/621; C08G 59/24; C08L 63/00
USPC ........................................... 430/280.1
See application file for complete search history.

(56) References Cited

U.S. PATENT DOCUMENTS

| 5,827,575 A | * | 10/1998 | Kasari | .............. B05D 1/36 427/379 |
| 2004/0198925 A1 | * | 10/2004 | Morita | .............. C08L 61/04 525/525 |
| 2009/0239080 A1 | * | 9/2009 | Ito | ............. C08F 212/14 428/411.1 |
| 2010/0196822 A1 | * | 8/2010 | Sasaki | ............. G03F 7/0233 430/280.1 |
| 2011/0254178 A1 | * | 10/2011 | Matsutani | ............. G03F 7/0233 257/788 |
| 2013/0260145 A1 | * | 10/2013 | Kishikawa | ........... C03C 17/3405 428/337 |
| 2016/0216608 A1 | * | 7/2016 | Iwashita | ............. H05K 3/287 |
| 2016/0246174 A1 | * | 8/2016 | Iwashita | ............. G03F 7/027 |

FOREIGN PATENT DOCUMENTS

| CN | 102257431 A | | 11/2011 |
| EP | 2 119 721 A1 | * | 11/2009 |
| JP | 2002-229204 A | | 8/2002 |
| JP | 2009-237378 A | * | 10/2009 |

(Continued)

OTHER PUBLICATIONS

Conley et al, "Negative tone aqueous developable resist for photo, electron and x-ray lithography", Porc. SPIE vol. 1262, Advances in Resist Technology and Processing VII, (Jun. 1, 1990) pp. 49-59.*
CAS Registry No. 244772-00-7, "EHPE 3150" downloaded from Scifinder database on Sep. 24, 2015, copyrighted by American Cheimcal Society, 1 page.*
CAS Registry No. 1153630-52-4, "EX 610U" downloaded from Scifinder database on Sep. 24, 2015, copyrighted by American Cheimcal Society, 2 pages.*

(Continued)

*Primary Examiner* — Cynthia Hamilton
(74) *Attorney, Agent, or Firm* — Fitch, Even, Tabin & Flannery, LLP

(57) ABSTRACT

Provided is a photosensitive resin composition comprising (A) a resin having a phenolic hydroxyl group; (B) an aliphatic or alicyclic epoxy compound having two or more oxirane rings; (C) a photosensitive acid generator; and (D) a solvent; wherein the photosensitive resin composition comprises 20 to 70 parts by mass of the component (B) relative to 100 parts by mass of the component (A).

12 Claims, 4 Drawing Sheets

(56) References Cited

FOREIGN PATENT DOCUMENTS

| JP | 2010-26278 | A | * | 2/2010 |
| JP | 2010-102271 | A | | 5/2010 |
| JP | 2010-134387 | A | | 6/2010 |
| JP | 2010-256508 | A | * | 11/2010 |
| JP | 2011-35173 | A | * | 2/2011 |
| JP | 2012-123378 | A | | 6/2012 |
| WO | 200801021 | A1 | | 1/2008 |
| WO | 2008026401 | A1 | | 3/2008 |
| WO | 2008/062406 | A2 | | 5/2008 |
| WO | 2008117619 | A1 | | 10/2008 |

OTHER PUBLICATIONS

English translation of JP 2010-026278 A generated Sep. 23, 2015 from AIPN Japan Patent Office National Center for Industrial Property Information and Training, 11 pages.*

English translation of JP 2010-256508 A generated Sep. 23, 2015 from AIPN Japan Patent Office National Center for Industrial Property Information and Training, 20 pages.*

English translation of WO 2008/47619 generated Sep. 24, 2015 from patentscope WIPO website with Google Translate, 14 pages.*

English translation of JP 2009-237378 A generated Sep. 23, 2015 from AIPN Japan Patent Office National Center for Industrial Property Information and Training, 65 pages.*

English translation of JP 2011-35173 A generated Sep. 23, 2015 from AIPN Japan Patent Office National Center for Industrial Property Information and Training, 57 pages.*

English translation of JP, 2012-123378, A (2012) from machine translation from AIPN Japan Patent Office National Center for Industrial Property Information and Training, generated Dec. 24, 2017, 28 pages.*

International Search Report for International Application No. PCT/JP2013/079927 dated Jan. 21, 2014.

International Preliminary Report on Patentability for International Application No. PCT/JP2013/079927, dated Jun. 30, 2015, mailed Jul. 9, 2015.

Office Action in counterpart TW Patent Application No. 102141926 dated Dec. 13, 2016.

Office Action of JP Patent Application No. P2014-554216 dated Jul. 18, 2017.

* cited by examiner

Film thickness: 25 μm, Width: 5 μm

PHOTOSENSITIVE RESIN COMPOSITION, PHOTOSENSITIVE FILM, AND METHOD FOR FORMING RESIST PATTERN

TECHNICAL FIELD

The present invention relates to a photosensitive resin composition, a photosensitive film, and a method for forming a resist pattern.

BACKGROUND ART

Currently, photosensitive resin compositions are widely used in various semiconductors and in microfabrication. In these applications, the photosensitive resin composition on a substrate is exposed to active rays and subjected to a proper treatment with a developer for selective removal of exposed portions or unexposed portions so as to form a resist pattern. During the treatment, optical processing is achieved by inducing changes in solubility of the photosensitive resin composition. The photosensitive resin composition may be either one of a positive type or a negative type, and the exposure with active rays is performed to increase or decrease the solubility in the developer, depending on the use.

Conventionally, materials including a combination of an acrylic photo-curing agent and an epoxy heat-curing agent have been used as the material system. For example, a photosensitive resin composition containing a novolac resin, an epoxy resin, and a photo-acid generator is disclosed in Patent Literatures 1 and 3, and a photosensitive resin composition containing an alkali-soluble epoxy compound having a carboxyl group and a photo-cationic polymerization initiator is disclosed in Patent Literature 4. Further, a photosensitive resin composition relating to a surface protective film or an interlayer insulating film of a semiconductor is described in Patent Literature 2.

CITATION LIST

Patent Literature

Patent Literature 1: JPH9-087366
Patent Literature 2: JP2003-215802
Patent Literature 3: JP2007-522531
Patent Literature 4: WO 2008/010521

SUMMARY OF INVENTION

Technical Problem

With speeding-up of electronic devices, the densification of a wiring board material has proceeded year by year. As a result, microfabrication of a solder resist and an interlayer insulating film for a wiring board has been also increasingly required. A photosensitive resin composition is, therefore, required to be excellent in photosensitive properties, heat resistance, electrical properties, mechanical properties, etc. However, although the photosensitive resin compositions described in the Citation List are excellent in insulation reliability, etc., a high resolution cannot be achieved when a thick film is made therefrom. For example, the photosensitive resin composition described in Patent Literature 1 provides a resolution with a space width of only about 40 μm when a coating film has a thickness of 50 μm. Further, the photosensitive resin composition described in Patent Literature 2 provides an excellent resolution with a space width of about 5 μm when a coating film has a thickness of 10 μm, but no satisfactory resolution can be obtained when a thick film is made therefrom.

An object of the present invention is to solve the above problems associated with the conventional arts and to provide a photosensitive resin composition excellent in the resolution and the heat resistance, even when a coating film having a thickness of more than 20 is formed. Further, another object of the present invention is to provide a cured product (insulating film) obtained by curing the photosensitive resin composition.

Solution to Problem

As a result of extensive studies to solve the above problems, the present inventors have found a photosensitive resin composition having excellent properties. Namely, the photosensitive resin composition of the present invention comprises: (A) a resin having a phenolic hydroxyl group; (B) an aliphatic or alicyclic epoxy compound having two or more oxirane rings; (C) a photosensitive acid generator; and (D) a solvent; wherein the photosensitive resin composition comprises 20 to 70 parts by mass of the component (B) relative to 100 parts by mass of the component (A).

The component (B) preferably has two or more glycidyl ether groups, and more preferably has three or more glycidyl ether groups.

The present invention also provides a photosensitive film comprising a substrate and a photosensitive layer of the photosensitive resin composition formed on the substrate.

The present invention further provides a cured product of the above described photosensitive resin composition. The cured product can be preferably used as a solder resist or an interlayer insulating film.

The present invention provides a method for forming a resist pattern comprising: a step of applying the photosensitive resin composition onto a substrate and drying the applied photosensitive resin composition so as to form a photosensitive layer, a step of exposing the photosensitive layer to an active ray so as to form a predetermined pattern and performing a heat-treatment after exposure (hereinafter, this heat-treatment is also referred to as "post-exposure baking"), and a step of developing the photosensitive layer after heat-treatment and heat-treating the obtained resin pattern.

The present invention further provides a method for forming a resist pattern comprising: a step of forming the photosensitive layer of the photosensitive film on a substrate, a step of exposing the photosensitive layer to an active ray so as to form a predetermined pattern and performing a post-exposure heat-treatment, and a step of developing the photosensitive layer after heat-treatment and heat-treating the obtained resin pattern.

Advantageous Effects of Invention

In applications involving the fabrication of advanced electronic packages requiring high density interconnectors, a photosensitive resin composition to form a resist pattern having a high aspect ratio (defined as "height of an image formed/width of an image formed") is required. The photosensitive resin composition of the present invention allows a resist pattern having a high aspect ratio with excellent resolution and heat resistance to be formed, even when a coating film having a thickness more than 20 μm is formed.

DESCRIPTION OF EMBODIMENTS

Figure 1:
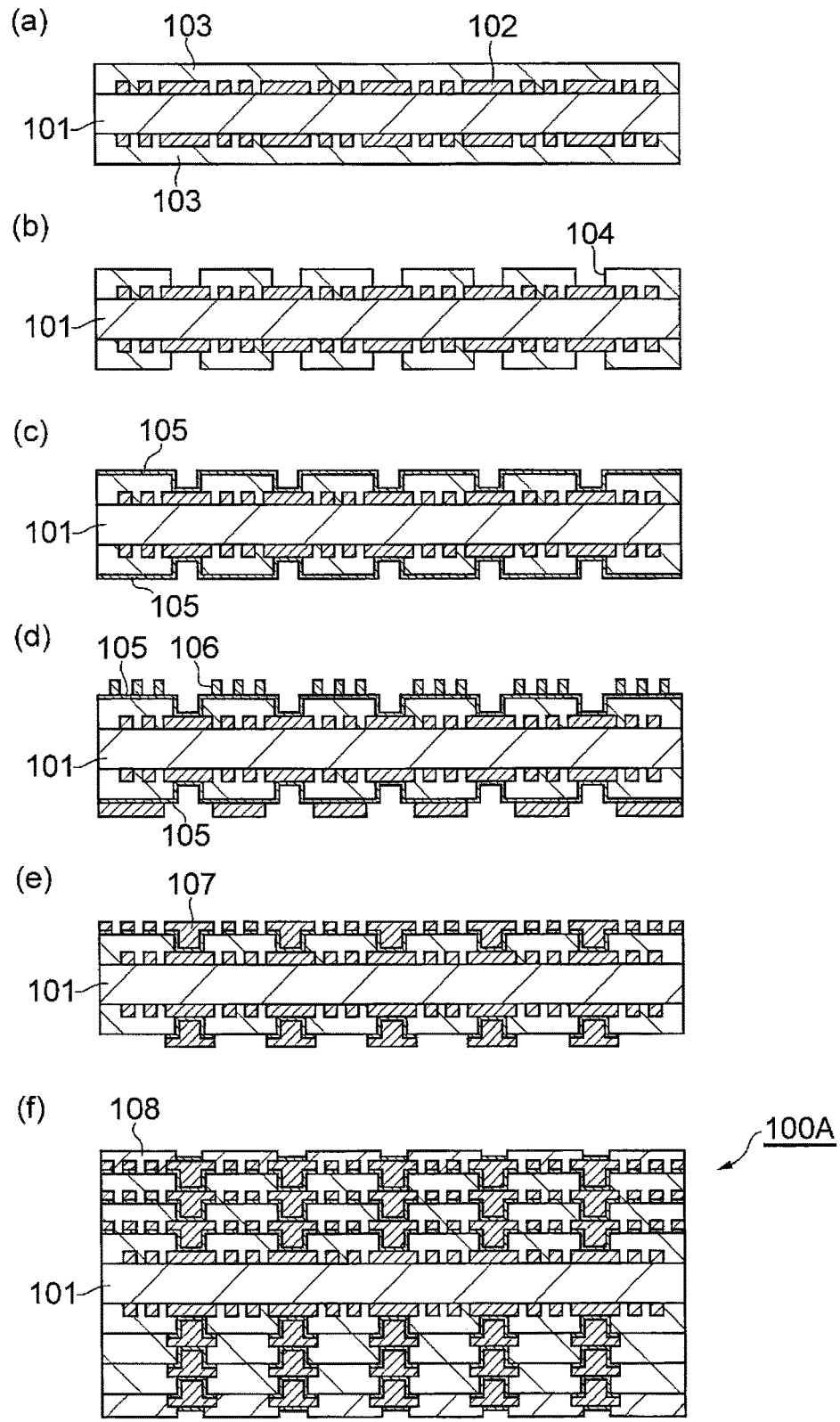
FIGS. 1(a)-(f) are schematic views illustrating the manufacturing method of a multi-layer printed wiring board in an embodiment of the present invention.

An embodiment of the present invention will be more specifically described in the following, though the present invention is not limited thereto.

[Photosensitive Resin Composition]

The photosensitive resin composition of the present embodiment comprises: (A) a resin having a phenolic hydroxyl group; (B) an aliphatic or alicyclic epoxy compound having two or more oxirane rings; (C) a photosensitive acid generator; and (D) a solvent. The photosensitive resin composition of the present embodiment may comprise: (E) a cross-linking agent; (F) a sensitizer; and the like, if necessary.

The present inventors presume the reason that a resin pattern having a high aspect ratio can be formed from the photosensitive resin composition of the present embodiment is as follows. First, the solubility of (A) the resin having a phenolic hydroxyl group in a developer is drastically improved with addition of the component (B) in unexposed portions. Second, due to the acid generated from (C) the photosensitive acid generator, not only the cross-linking resulting from the reaction of two or more oxirane rings of the component (B), but also the reaction of them with the phenolic hydroxyl group of the component (A) occur, so that the solubility of the composition in the developer is drastically reduced in exposed portions. The present inventors presume that the difference in solubility in a developer between unexposed portions and exposed portions becomes thereby pronounced when developed, so that sufficient resolution can be obtained; and presume that due to the heat treatment of the developed pattern, the cross-linking of the component (B) and the reaction of it with the component (A) further proceed, so that a resin pattern having sufficient heat resistance can be obtained.

<Component (A)>

Examples of the resin having a phenolic hydroxyl group as component (A) preferably include a resin soluble in an alkali aqueous solution, particularly preferably a novolac resin, though not specifically limited. The novolac resin can be obtained from condensation of phenols and aldehydes under presence of a catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, β-naphthol, etc.

Further, examples of the aldehydes include formaldehyde, paraformaldehyde, acetaldehyde, benzaldehyde, etc.

Specific examples of the novolac resin include a phenol/formaldehyde condensation novolac resin, a cresol/formaldehyde condensation novolac resin, a phenol-naphthol/formaldehyde condensation novolac resin, etc.

Further, examples of the component (A) other than novolac resins include polyhydroxystyrene and a copolymer thereof, a phenol-xylylene glycol condensation resin, a cresol-xylylene glycol condensation resin, a phenol-dicyclopentadiene condensate resin, etc. A single kind of the component (A) or a mixture of two or more kinds of the components (A) may be used.

From the viewpoints of the resolution, developability, thermal shock, heat resistance, etc., of a cured film to be obtained, the component (A) has a weight average molecular weight of preferably 100000 or less, more preferably 1000 to 80000, furthermore preferably 2000 to 50000, particularly preferably 2000 to 20000, extremely preferably 5000 to 15000.

The photosensitive resin composition of the present embodiment has a content of component (A) of, preferably 30 to 90 parts by mass, more preferably 40 to 80 parts by mass, relative to 100 parts by mass in total of the photosensitive resin composition except for the component (D). With a proportion of the component (A) in the above range, the film formed from the photosensitive resin composition to be obtained has more excellent developability in an alkali aqueous solution.

<Component (B)>

The aliphatic or alicyclic epoxy compound having two or more oxirane rings as component (B) is preferably an epoxy compound having a weight average molecular weight of preferably 1000 or less. Further, the component (B) is preferably a compound having two or more glycidyl ether groups, more preferably a compound having three or more glycidyl ether groups. In the present specification, the term "aliphatic or alicyclic epoxy compound" means a compound having an aliphatic skeleton and/or an alicyclic skeleton as the main skeleton, having no aromatic or heterocyclic ring.

Examples of the component (B) include ethylene glycol diglycidyl ether, diethylene glycol diglycidyl ether, propylene glycol diglycidyl ether, tripropylene glycol diglycidyl ether, neopentyl glycol diglycidyl ether, 1,6-hexanediol diglycidyl ether, glycerol diglycidyl ether, pentaerythritol tetraglycidyl ether, trimethylol ethane triglycidyl ether, trimethylolpropane triglycidyl ether, glycerol propoxylate triglycidyl ether, dicyclopentadiene dioxide, 1,2,5,6-diepoxycyclooctane, 1,4-cyclohexanedimethanol diglycidyl ether, diglycidyl 1,2-cyclohexane dicarboxylate, 3,4-epoxycyclohexylmethyl 3',4'-epoxycyclohexane carboxylate, bis(3,4-epoxycyclohexylmethyl) adipate, and cyclohexene oxide-type epoxy resin, etc.

Among the components (B), trimethylolethane triglycidyl ether or trimethylolpropane triglycidyl ether is preferred, in terms of the excellent sensitivity and resolution.

Examples of the commercially available component (B) include EPOLIGHT 40E, EPOLIGHT 100E, EPOLIGHT 70P, EPOLIGHT 200P, EPOLIGHT 1500NP, EPOLIGHT 1600, EPOLIGHT 80MF, and EPOLIGHT 100MF (all the above are made by Kyoeisha Chemical Co., Ltd., trade names), an alkyl-type epoxy resin ZX-1542 (made by Nippon Steel and Sumikin Chemical Co., Ltd., trade name), DENACOL EX-212L, DENACOL EX-214L, DENACOL EX-216L, DENACOL EX-321L, and DENACOL EX-850L (all the above made by Nagase ChemteX Corporation, trade names). A single kind of the component (B) or a mixture of two or more kinds of the components (B) may be used.

In the photosensitive resin composition of the present embodiment, the content of component (B) is 20 to 70 parts by mass, preferably 25 to 65 parts by mass, more preferably 35 to 55 parts by mass, relative to the 100 parts by mass of the component (A). With a content of component (B) of 20 parts by mass or more, the resolution tends to be more easily improved due to sufficient cross-linking in exposed portions. With a content of 70 parts by mass or less, film formation of the photosensitive resin composition can be easily performed on a desired substrate and the resolution tends to hardly decrease.

<Component (C)>

The photosensitive acid generator as component (C) is a compound which generates an acid upon irradiation with active rays or the like. Due to the acid generated, not only the cross-linking of the component (B) to each other, but also the reaction of the component (B) with the phenolic hydroxyl group of the component (A) occur, so that the solubility of the composition in the developer decreases drastically.

The component (C) is not specifically limited as long as being a compound which generates an acid with irradiation of active rays, and examples thereof include an onium salt compound, a halogen-containing compound, a diazoketone compound, a sulfone compound, a sulfonic acid compound, a sulfonimide compound, and a diazomethane compound, etc. Among them, use of a sulfonimide compound or an onium salt compound is preferred from the viewpoint of easier availability. In particular, use of an onium salt compound is preferred from the viewpoint of solubility in the component (F) as solvent.

Onium Salt Compound:

Examples of the onium salt compound include an iodonium salt, a sulfonium salt, a phosphonium salt, a diazonium salt and a pyridinium salt. Specific preferred examples of the onium salt compound include a diaryliodonium salt such as a diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate; a triarylsulfonium salt such as triphenylsulfonium trifluoromethanesulfonate, triphenylsulfonium p-toluenesulfonate, and triphenylsulfonium hexafluoroantimonate; 4-t-butylphenyl-diphenysulfonium trifluoromethanesulfonate; 4-t-butylphenyl-diphenylsulfonium p-toluenesulfonate; and 4,7-di-n-butoxynaphthyl tetrahydrothiophenium trifluoromethanesulfonate.

Halogen-Containing Compound:

Examples of the halogen-containing compound include a haloalkyl group-containing hydrocarbon compound and a haloalkyl group-containing heterocyclic compound. Specific preferred examples of the halogen-containing compound include 1,10-dibromo-n-decane, 1,1-bis(4-chlorophenyl)-2,2,2-trichloroethane; and an s-triazine derivative such as phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine.

Diazoketone Compound:

Examples of the diazoketone compound include a 1,3-diketo-2-diazo compound, a diazobenzoquinone compound, and a diazonaphthoquinone compound. Specific examples thereof include a 1,2-naphthoquinonediazide-4-sulfonic acid ester compound of phenols.

Sulfone Compound:

Examples of the sulfone compound include a β-ketosulfone compound, a β-sulfonylsulfone compound, and an α-diazo compound thereof. Specific examples thereof include 4-tolylphenacylsulfone, mesitylphenacylsulfone, bis(phenacylsulfonyl)methane, etc.

Sulfonic Acid Compound:

Examples of the sulfonic acid compound include alkylsulfonates, haloalkylsulfonates, arylsulfonates, iminosulfonates, etc. Specific preferred examples thereof include benzoin p-toluenesulfonate, pyrogallol tris-trifluoromethanesulfonate, o-nitrobenzyl trifluoromethanesulfonate, o-nitrobenzyl p-toluenesulfonate, etc.

Sulfonimide Compound:

Specific examples of the sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)naphthalimide, N-(p-toluenesulfonyloxy)-1,8-naphthalimide, N-(10-camphorsulfonyloxy)-1,8-naphthalimide, etc.

Diazomethane Compound:

Specific examples of the diazomethane compound include bis(trifluoromethylsulfonyl)diazomethane, bis(cyclohexylsulfonyl)diazomethane, and bis(phenylsulfonyl)diazomethane.

In the present embodiment, the component (C) is preferably a compound having a trifluoromethanesulfonate group, a hexafluoroantimonate group, a hexafluorophosphate group, or a tetrafluoroborate group, in terms of having excellent sensitivity and resolution. Incidentally, a single kind of the component (C) or a mixture of two or more kinds of the components (C) may be used.

In the photosensitive resin composition of the present embodiment, the content of the component (C) is preferably 0.1 to 15 parts by mass, more preferably 0.3 to 10 parts by mass, relative to 100 parts by mass of the component (A), from the viewpoint of ensuring the sensitivity, the resolution, the pattern shape and the like of the photosensitive resin composition of the present embodiment.

<Component (D)>

The solvent as component (D) is added to improve the handling properties of the photosensitive resin composition, or to control the viscosity and the storage stability. The component (D) is preferably an organic solvent. The kind of the organic solvent is not specifically limited as long as capable of exhibiting the performance above-mentioned, and examples thereof include ethylene glycol monoalkyl ether acetates such as ethylene glycol monomethyl ether acetate and ethylene glycol monoethyl ether acetate; propylene glycol monoalkyl ethers such as propylene glycol monomethyl ether, propylene glycol monoethyl ether, propylene glycol monopropyl ether, and propylene glycol monobutyl ether; propylene glycol dialkyl ethers such as propylene glycol dimethyl ether, propylene glycol diethyl ether, propylene glycol dipropyl ether, and propylene glycol dibutyl ether; propylene glycol monoalkyl ether acetates such as propylene glycol monomethyl ether acetate, propylene glycol monoethyl ether acetate, propylene glycol monopropyl ether acetate, and propylene glycol monobutyl ether acetate; cellosolves such as ethyl cellosolve and butyl cellosolve, carbitols such as butyl carbitol; lactates such as methyl lactate, ethyl lactate, n-propyl lactate, and isopropyl lactate; aliphatic carboxylic acid esters such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate; other esters such as 3-methoxy methyl propionate, 3-methoxy ethyl propionate, 3-ethoxy methyl propionate, 3-ethoxy ethyl propionate, methyl pyruvate, and ethyl pyruvate; aromatic hydrocarbons such as toluene and xylene; ketones such as 2-butanone, 2-heptanone, 3-heptanone, 4-heptanone, and cyclohexanone; amides such as N,N-dimethylformamide, N-methylacetamide, N,N-dimethylacetamide, and N-methylpyrrolidone; and lactones such as γ-butyrolactone. A single kind of the organic solvent or a mixture of two or more kinds of the organic solvents may be used.

In the photosensitive resin composition of the present embodiment, the content of the component (D) is preferably 30 to 200 parts by mass, more preferably 60 to 120 parts by mass, relative to 100 parts by mass of the total amount of the photosensitive resin composition except for the component (D).

<Component (E)>

The photosensitive resin composition of the present embodiment may further comprise a cross-linking agent as component (E), if necessary. Inclusion of the component (E) prevents the resin pattern from being embrittled and deformed when the photosensitive layer is cured by heating after formation of the resin pattern, due to formation of a cross-linked structure resulting from the reaction of the component (E) with the component (A).

Specific preferred examples of the component (E) for use include a compound having a phenolic hydroxyl group (though excluding the component (A)) and a compound having a hydroxymethylamino group. A single kind of the component (E) or a mixture of two or more kinds of the components (E) may be used.

The "compound having a phenolic hydroxyl group" for use as component (E) preferably further includes a methylol group or an alkoxyalkyl group. The compound having a phenolic hydroxyl group as component (E) increases the dissolution rate of unexposed portions in development in an alkali aqueous solution and improves the sensitivity. The weight average molecular weight of the compound having a phenolic hydroxyl group is preferably 2000 or less. In view of the balance among the solubility in an alkali aqueous solution, the photosensitivity, and the mechanical properties, the number average molecular weight is preferably 94 to 2000, more preferably 108 to 2000, furthermore preferably 108 to 1500.

Although a conventionally known compound may be the "compound having a phenolic hydroxyl group" for use as component (E), use of a compound represented by the following formula (1) is preferred due to excellent balance between the effect of enhancing dissolution of unexposed portions and the effect of preventing deformation of the resin pattern after curing by heating:

[Chemical Formula 1]

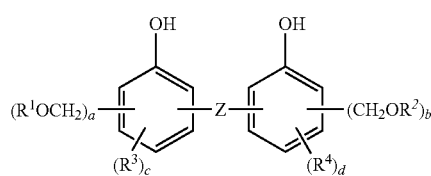

(1)

wherein Z represents a single bond or a divalent organic group, $R^1$ and $R^2$ each independently represent a hydrogen atom or a monovalent organic group, $R^3$ and $R^4$ each independently represent a monovalent organic group, a and b each independently represent an integer of 1 to 3, and c and d each independently represent an integer of 0 to 3.

The compound with a single bond as Z in the formula (1) is a biphenol (dihydroxy biphenyl) derivative. Further, examples of the divalent organic group represented by Z include: an alkylene group having 1 to 10 carbon atoms such as a methylene group, an ethylene group, and a propylene group; an alkylidene group having 2 to 10 carbon atoms such as an ethylidene group; an arylene group having 6 to 30 carbon atoms such as a phenylene group; a group having any of these hydrocarbon groups with a part or the whole of hydrogen atoms being substituted with halogen atoms such as fluorine atoms; a sulfonyl group; a carbonyl group; an ether bond; a sulfide bond; an amide bond; etc. Among these, Z is preferably a divalent organic group represented by the following formula (2):

[Chemical Formula 2]

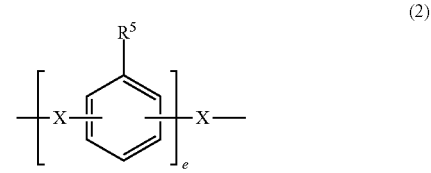

(2)

wherein X represents a single bond, an alkylene group (e.g. an alkylene group having 1 to 10 carbon atoms), an alkylidene group (e.g. an alkylidene group having 2 to 10 carbon atoms), any of these groups with a part or the whole of hydrogen atoms being substituted with halogen atoms, a sulfonyl group, a carbonyl group, an ether bond, a sulfide bond, or an amide bond; $R^5$ represents a hydrogen atom, a hydroxyl group, an alkyl group, or a haloalkyl group; e represents an integer of 1 to 10; and a plurality of $R^5$ may be the same or different from each other.

Examples of the compound having a hydroxymethylamino group include a nitrogen-containing compound having methylol groups partially or totally alkyl-etherified such as (poly)(N-hydroxymethyl)melamine, (poly)(N-hydroxymethyl)glycoluril, (poly)(N-hydroxymethyl)benzoguanamine, (poly)(N-hydroxymethyl)urea, etc. Examples of the alkyl group of an alkyl ether include a methyl group, an ethyl group, a butyl group, and a mixture thereof, and also these compounds may contain an oligomer component formed by partial self-condensation. Specific examples thereof include hexakis(methoxymethyl)melamine, hexakis(butoxymethyl)melamine, tetrakis(methoxymethyl)glycoluril, tetrakis(butoxymethyl)glycoluril, tetrakis(methoxymethyl)urea, etc.

In the photosensitive resin composition of the present embodiment, the content of component (E) is preferably 5 to 50 parts by mass, more preferably 5 to 30 parts by mass, relative to 100 parts by mass of the component (A).

<Component (F)>

The photosensitive resin composition of the present embodiment may further comprise a sensitizer as component (F), if necessary. Inclusion of the component (F) can improve the sensitivity of the photosensitive resin composition. Examples of the sensitizer include 9,10-dibutoxyanthracene, etc. A single kind of the component (F) or a mixture of two or more kinds of the components (F) may be used.

In the photosensitive resin composition of the present embodiment, the content of the component (F) is preferably 0.01 to 1.5 parts by mass, more preferably 0.05 to 0.5 parts by mass, relative to 100 parts by mass of the component (A)

The photosensitive resin composition of the present embodiment may further comprise a low-molecular weight phenolic compound having a molecular weight less than 1000 (hereinafter referred to as "phenol compound (a)") in addition to the component (A). Examples thereof include 4,4'-dihydroxydiphenylmethane, 4,4'-dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}ph enyl]ethane, 1,1,2,2-tetra(4-hydroxyphenyl) ethane, etc. These phenol compounds (a) can be contained in the range of 0 to 40 mass %, particularly 0 to 30 mass %, relative to the component (A).

The photosensitive resin composition of the present embodiment may comprise other components other than the above components. Examples of the other component include an inorganic filler, an adhesion aid, a leveling agent, etc.

<Photosensitive Film>

The photosensitive film of the present embodiment will be described in the following.

The photosensitive film of the present embodiment comprises a substrate and a photosensitive layer of the above-described photosensitive resin composition formed on the substrate. A protective layer for covering the photosensitive layer may be further provided on the photosensitive layer.

Examples of the above-described substrate for use include a polymer film of polyethylene terephthalate, polypropylene, polyethylene, polyester, or the like, having heat resistance and solvent resistance. The thickness of the substrate (polymer film) is preferably set to 5 to 25 μm. The polymer films for use may be laminated on both sides of a photosensitive layer, including one as substrate and another as protective film.

Examples of the above-described protective film for use include a polymer film of polyethylene terephthalate, polypropylene, polyethylene, polyester, or the like, having heat resistance and solvent resistance.

The photosensitive layer may be formed by applying the photosensitive resin composition on a substrate or a protective film. Examples of the coating method include dipping, spraying, bar coating, roll coating, spin coating, etc. Although the thickness of the photosensitive layer is different depending on the use, the dried photosensitive layer has a thickness of preferably 10 to 100 μm, more preferably 15 to 60 μm, particularly preferably 20 to 50 μm.

[Method for Forming Resist Pattern]

The method for forming a resist pattern of the present embodiment is described below.

First, a photosensitive layer made from the above-described photosensitive resin composition is formed on a substrate (a copper foil coated with a resin, a copper-clad laminate, a silicon wafer coated with a metal-sputtered film, an alumina substrate, etc.) on which a resist is to be formed. Examples of the method for forming the photosensitive layer include: a method of applying the photosensitive resin composition to a substrate and drying to evaporate the solvent and the like so as to form a coating film (photosensitive layer); and a method of transferring the photosensitive layer of the above-described photosensitive film onto a substrate; etc.

Examples of the method for use in applying the photosensitive resin composition to a substrate include an application method such as dipping, spraying, bar coating, roll coating, spin coating, etc. The thickness of the coating film can be appropriately controlled by adjusting the coating means, and the solid content and viscosity of the photosensitive resin composition.

Subsequently, the photosensitive layer is exposed to an active ray through a predetermined mask so as to form a predetermined pattern. Examples of the active ray for use in exposure include rays for use in a g-line stepper; ultraviolet rays for use in a low pressure mercury lamp, a high pressure mercury lamp, a metal halide lamp, and an i-line stepper; electron beams; laser beams; etc. The exposure dose is appropriately selected according to the light source for use and the thickness of a coating film, and the like, and may be, for example, about 1000 to 20000 J/m² for a coating film thickness of 10 to 50 μm with ultraviolet irradiation from a high pressure mercury lamp.

Further, a heat treatment is performed after exposure (post-exposure baking). The post-exposure baking can accelerate the curing reaction between the component (A) and the component (B) due to the generated acid. Although the conditions for the post-exposure baking are different depending on the content of the photosensitive resin composition, the thickness of the coating film, and the like, heating at 70 to 150° C. for about 1 to 60 minutes is typically preferred, and heating at 80 to 120° C. for about 1 to 60 minutes is more preferred Subsequently, the coating film after subjected to post-exposure baking is developed in alkali developer, so that regions other than photo-cured portions (unexposed portions) are dissolved and removed to obtain a desired resin pattern. Examples of the development method in this case include shower developing, spray developing, dip developing, paddle developing, etc. Typical development conditions are at 20 to 40° C. for about 1 to 10 minutes.

Examples of the alkali developer include an alkali aqueous solution containing an alkali compound such as sodium hydroxide, potassium hydroxide, tetramethylammonium hydroxide, choline, etc., dissolved in water at a concentration of about 1 to 10 mass %, an alkali aqueous solution such as an aqueous ammonia solution, etc. A water soluble organic solvent such as methanol and ethanol, a surfactant, or the like in an appropriate amount may be added to the alkali aqueous solution. After development with the alkali developer, washing with water and drying are performed. Tetramethylammonium hydroxide is preferred as alkali developer, in terms of achieving excellent resolution.

Further, through a heat treatment for imparting insulating film properties, a cured film (resist pattern) is obtained. Curing conditions of the photosensitive resin composition are not specifically limited, so that the photosensitive resin composition can be cured by heating at 50 to 200° C. for about 30 minutes to 10 hours, depending on the use of the cured product.

Further, the heat treatment may be performed in two stages for sufficient progress of curing and prevention of deformation of the obtained shape of a resin pattern. For example, curing may be performed by heating at 50 to 120° C. for about 5 minutes to 2 hours in a first stage, and at 80 to 200° C. for about 10 minutes to 10 hours in a second stage.

Heating facilities are not specifically limited as long as the above-described conditions are satisfied, so that an oven in common use, an infrared furnace, etc., may be used.

[Multi-Layer Printed Wiring Board]

The cured product formed from the photosensitive resin composition of the present embodiment can be suitably used as a solder resist and/or an interlayer insulating film in a multi-layer printed wiring board. FIG. 1 is a schematic view illustrating the manufacturing method of a multi-layer printed wiring board which comprises the cured product formed from the photosensitive resin composition of the present embodiment as a solder resist and/or an interlayer insulating film. The multi-layer printed wiring board 100A shown in FIG. 1(f) has wiring patterns on the surface and on the inside. The multi-layer printed wiring board 100A is obtained by stacking a copper-clad laminate, an interlayer insulating film, and a metal foil, etc., and appropriately forming wiring patterns by etching or a semi-additive method. The manufacturing method of a multi-layer printed wiring board 100A is briefly described in the following with reference to FIG. 1.

First, interlayer insulating films 103 are respectively formed on both sides of the copper-clad laminate 101 having a wiring pattern 102 on the surface (refer to FIG. 1(a)). The interlayer insulating films 103 may be formed by printing with a screen printing machine or a roll coater using the photosensitive resin composition, or by previously preparing the photosensitive film and sticking the photosensitive layer of the photosensitive film to the surface of a printed wiring board with a laminates. Subsequently, an orifices 104 are formed at portions required to be electrically connected to the outside with YAG laser or carbon dioxide laser (refer to FIG. 1(b)). Smears (residues) around the orifices 104 are removed by a desmearing treatment. Subsequently, a seed layer 105 is formed by electroless plating (refer to FIG. 1(c)). A photosensitive layer formed from the above-described photosensitive resin composition is laminated on the seed layer 105, and predetermined portions are subjected to exposure and developing treatment so as to form a wiring pattern 106 (refer to FIG. 1(d)). Subsequently, a wiring pattern 107 is formed by electrolytic plating, and the cured product of the photosensitive resin composition is removed with a stripping solution. The seed layer 105 is then removed by etching (refer to FIG. 1(e)). The above-described operations are repeated, so that a solder resist 108 formed of the cured product of the photosensitive resin composition is formed on the outermost surface. Consequently the multi-layer printed wiring board 100A can be thus formed (refer to FIG. 1(f)).

The thus obtained multi-layer printed wiring board 100A allows the semiconductor elements mounted at corresponding positions to have ensured electrical connection.

EXAMPLES

The present invention will be illustrated in detail with reference to Examples and Comparative Examples as follows, but the present invention is not limited to the Examples in any way. In the following Examples and Comparative Examples, "part" means "part by mass" unless otherwise specified.

<Evaluation of Alkali Solubility>

A resin composition was obtained by mixing 100 parts by mass of novolac resin (A-1), 43 parts by mass of an epoxy compound (B-1 to B-7 and B'-8 to B'-13), and 100 parts by mass of a solvent (D-1).

A 6-inch silicon wafer was spin-coated with the resin composition, which was heated at 65° C. for 2 minutes and then at 95° C. for 8 minutes on a hot plate, so that a uniform coating film having a thickness of 25 μm was prepared. The prepared coating film was immersed in 2.38 mass % tetramethylammonium hydroxide aqueous solution at 23° C. in a Petri dish, and the complete dissolution time was measured. The dissolution rate (nm/sec) was calculated from (film thickness after film formation)/(complete dissolution time). Further, the solubility was evaluated according to the following criteria. The evaluation results are shown in Table 1.

<Evaluation Criteria of Solubility>
A: uniformly dissolved.
B: dissolved, accompanied by turbidity.
C: undissolved.

TABLE 1

| Item | Reference Example | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| A-1 | 100 | 100 | 100 | 100 | 100 | 100 | 100 | 100 | 100 | 100 | 100 | 100 | 100 | 100 |
| B-1 | 43 | — | — | — | — | — | — | — | — | — | — | — | — | — |
| B-2 | — | 43 | — | — | — | — | — | — | — | — | — | — | — | — |
| B-3 | — | — | 43 | — | — | — | — | — | — | — | — | — | — | — |
| B-4 | — | — | — | 43 | — | — | — | — | — | — | — | — | — | — |
| B-5 | — | — | — | — | 43 | — | — | — | — | — | — | — | — | — |
| B-6 | — | — | — | — | — | 43 | — | — | — | — | — | — | — | — |
| B-7 | — | — | — | — | — | — | 43 | — | — | — | — | — | — | — |
| B'-8 | — | — | — | — | — | — | — | 43 | — | — | — | — | — | — |
| B'-9 | — | — | — | — | — | — | — | — | 43 | — | — | — | — | — |
| B'-10 | — | — | — | — | — | — | — | — | — | 43 | — | — | — | — |
| B'-11 | — | — | — | — | — | — | — | — | — | — | 43 | — | — | — |
| B'-12 | — | — | — | — | — | — | — | — | — | — | — | 43 | — | — |
| B'-13 | — | — | — | — | — | — | — | — | — | — | — | — | 43 | 43 |
| D-1 | 100 | 100 | 100 | 100 | 100 | 100 | 100 | 100 | 100 | 100 | 100 | 100 | 100 | 100 |
| Solubility | A | A | A | A | A | A | A | A | A | B | B | C | C | B |
| Dissolving rate (nm/sec) | 144 | 240 | 170 | 156 | 281 | 270 | 175 | 98 | 69 | 76 | 90 | <0.7 | <0.7 | 88 |

The components described in Table 1 are as follows.

A-1: novolac resin (made by Asahi Organic Chemicals Industry Co., Ltd., trade name: MXP5560BF, a weight average molecular weight-7800)

B-1: dicyclopentadiene dioxide (made by Sigma-Aldrich, trade name)

B-2: 1,4-cyclohexanedimethanol diglycidyl ether (made by Sigma-Aldrich, trade name)

B-3: propyleneglycol diglycidyl ether (made by Kyoeisha Chemical Co., Ltd., trade name: EPOLITE 70P)

B-4: neopentylglycol diglycidyl ether (made by Kyoeisha Chemical Co., Ltd., trade name: EPOLITE 1500NP)

B-5: trimethylolethane triglycidyl ether (made by Sigma-Aldrich, trade name)

B-6: trimethylolpropane triglycidyl ether (made by Nippon Steel and Sumikin Chemical Co., Ltd., trade name: ZX-1542, refer to the following formula (3))

[Chemical Formula 3]

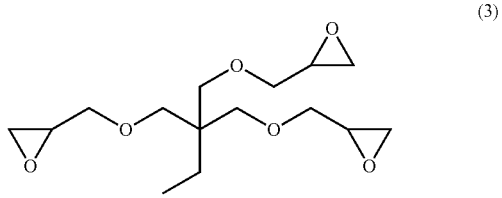

(3)

B-7: a cyclohexene oxide-type epoxy resin (made by Daicel Corporation, trade name: CEL2021P, refer to the following formula (4))

[Chemical Formula 4]

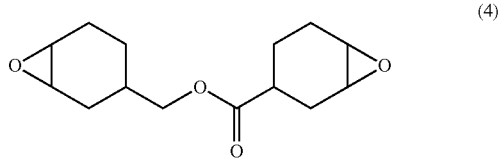

(4)

B'-8: ethyl glycidyl ether (made by Tokyo Chemical Industry Co., Ltd., trade name)

B'-9: phenyl glycidyl ether (made by Wako Pure Chemical Industries Ltd., trade name)

IT-10: resorcinol diglycidyl ether (made by Sigma-Aldrich, trade name)

B'-11: tris(4-hydroxyphenyl)methane triglycidyl ether (made by Sigma-Aldrich, trade name)

B'-12: a biphenyl aralkyl-type epoxy resin (made by Nippon Kayaku Co., Ltd., trade name: NC-3000H, refer to the following formula (5))

[Chemical Formula 5]

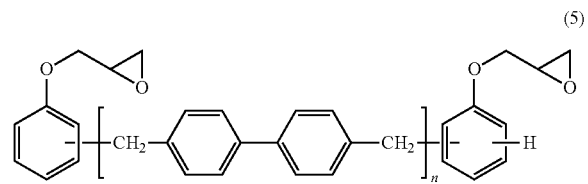

(5)

B'-13: an isocyanurate-type epoxy resin (made by Shikoku Chemicals Corporation, trade name: MA-DGIC, refer to the following formula (6))

[Chemical Formula 6]

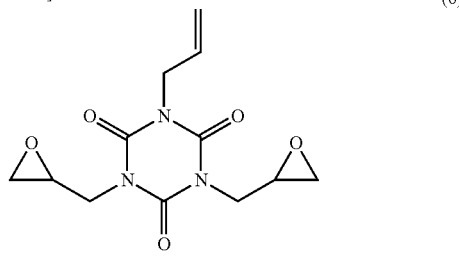

(6)

D-1: propyleneglycol monoethyl ether acetate (made by Wako Pure Chemical Industries Ltd., trade name)

According to the above results, Reference Examples 1 to 7 had better solubility in an alkali aqueous solution with an improved dissolution rate in comparison with Reference Example 8 which did not comprise component (B). In contrast, Reference Examples 9 to 14 to which an epoxy compound other than the component (B) was added had a lowered dissolving rate, and Reference Examples 10 to 14 had a lowered solubility in an alkali aqueous solution.

<Evaluation of Resolution>

A photosensitive resin composition was obtained by blending predetermined amounts of an epoxy compound (B-1 to B-7 and B'-8 to B'-10), a photosensitive acid generator (C-1), a solvent (D-1), and a sensitizer (F-1) shown in Table 2 with 100 parts by mass of a novolac resin (A-1 to A-3).

A 6-inch silicon wafer was spin-coated with the photosensitive resin composition, which was heated at 65° C. for 2 minutes and then at 95° C. for 8 minutes on a hot plate, so that a uniform coating film having a thickness of 25 μm was prepared. The prepared coating film was subjected to reduced projection exposure to i-line (wavelength: 365 nm) through a mask by using an i-line stepper (made by Canon Inc., trade name: FPA-3000iW). The mask for use had patterns with a ratio of exposed portions to unexposed portions of 1:1 at 1 μm intervals from 2 μm:2 μm to 30 μm:30 μm. Further, reduction projection exposure was performed with changing the exposure dose at an interval of 50 mJ/cm$^2$ in the range of 50 to 950 mJ/cm$^2$.

Subsequently the exposed coating film was heated at 65° C. for 1 minute and then at 95° C. for 4 minutes (post-exposure baking), and then immersed in 2.38 mass % tetramethylammonium hydroxide aqueous solution for a time period 1.5 times the minimum developing time period (minimum time period for removal of unexposed portions) for development, and unexposed portions were removed in the developing treatment. After developing treatment, the formed resist pattern was observed with a metallurgical microscope. The smallest space width of the resin patterns having clearly removed space portions (unexposed portions) and line portions (exposed portions) formed without occurrence of meandering or chipping was assumed to be the minimum resolution, and the exposure dose on that occasion was evaluated. The evaluation results are shown in Table 2.

The results in Table 2 show that high-resolution patterns were obtained with less exposure dose in Examples 1 to 7, in comparison with Comparative Examples 1 to 5. Further, it was found that high-resolution pattern was not obtained in Comparative Examples 4 and 5, in comparison with Examples 4 and 5.

Figure 2:
FIG. 2 is a metallurgical microscope photograph showing a resin pattern formed from the photosensitive resin composition in Example 4.
Figure 3:
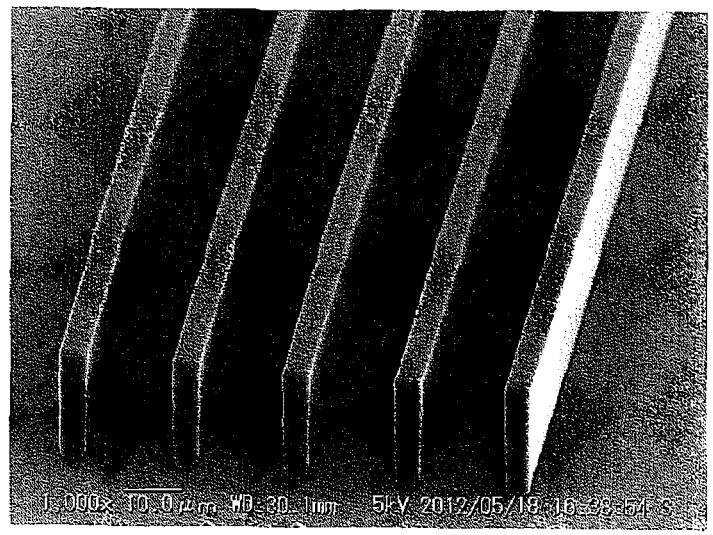
FIG. 3 is a scanning electron microscope photograph showing a resin pattern formed from the photosensitive resin composition in Example 4.
Figure 4:
FIG. 4 is a metallurgical microscope photograph showing a resin pattern formed from the photosensitive resin composition in Comparative Example 3.

FIG. 2 is a metallurgical microscope photograph showing a resin pattern formed from the photosensitive resin composition in Example 4. FIG. 3 is a scanning electron microscope photograph showing a resin pattern formed from the photosensitive resin composition in Example 4. In contrast, FIG. 4 is a metallurgical microscope photograph showing a resin pattern formed from the photosensitive resin composition in Comparative Example 3. As shown in these Figures, with use of the photosensitive resin composition in Example 4, the space portions were clearly removed and a resin pattern having a resolution of 5 μm was formed. On the other hand, with use of the photosensitive resin composition in Comparative Example 3, the formed resin pattern accompanied meandering and detachment, having a resolution of 14 μm.

15

<Evaluation of Heat Resistance>

Subsequently the photosensitive resin composition in Example 4 was uniformly applied on a polyethylene terephthalate film (made by Teijin DuPont Films Ltd., trade name: PUREX A53), and dried at 90° C. for 10 minutes with a hot air convection dryer, so that a dried photosensitive layer having a thickness of 40 μm was formed. Subsequently, the photosensitive layer was exposed to have an irradiation energy of 400 mJ/cm$^2$ with an exposure machine having a high-pressure mercury lamp (made by ORC Manufacturing Co., Ltd., trade name: EXM-1201). The exposed photosensitive layer was heated at 65° C. for 2 minutes and then at 95° C. for 8 minutes on a hot plate, subjected to a heat treatment at 180° C. for 60 minutes with a hot air convection dryer, and then peeled from the polyethylene terephthalate film so as to obtain a cured film. Using a thermomechanical analyzer (made by Seiko Instruments Inc., trade name: TMA/SS6000), the thermal expansion coefficient of the cured film with temperature increase at a rate of temperature rise of 5° C./min was measured. From the measurement curve, an inflection point was obtained as the glass transition temperature Tg. The measurement conditions of the thermal expansion coefficient were as follows:

Sample width: 2 mm
Sample length: 20 mm
Distance between chucks: 10 mm
Load: 5 gf (0.05 N)
Peeling rate: 5 mm/min
Measurement temperature range: 18 to 420° C.

As a result, it was found that each of Examples 1 to 10 had a glass transition temperature of 90° C. or higher, having excellent heat resistance. Other evaluation results are shown in Table 2.

As shown in Table 2, Examples 1 to 10 had an exposure dose required for curing of 800 mJ/cm$^2$ or less, a minimum resolution of 9 or less, and excellent heat resistance. On the other hand, Comparative Examples 1 to 3 and 7 not containing an aliphatic or alicyclic epoxy compound having 2 or more oxirane rings had a higher exposure dose required for curing and a larger minimum resolution in comparison with Examples 1 to 10. Furthermore, Examples 4, 5, 9, and 10 containing 20 to 70 parts by mass of the component (B) relative to 100 parts by mass of component (A) had a more excellent balance among the exposure dose required for curing, the resolution, and the heat resistance, in comparison with Comparative Examples 4 to 6.

INDUSTRIAL APPLICABILITY

The photosensitive resin composition of the present invention is applied as a material for use in a solder resist or an interlayer insulating film of a wiring board material, or a surface protective film (overcoat film) or an interlayer insulating film (passivation film) of a semiconductor device or the like. In particular, due to excellent in any of the sensitivity, the resolution, and the heat resistance after curing, the photosensitive resin composition is suitably used for a high-density package substrate having thinned wiring and high density.

REFERENCE SIGNS LIST

100A: MULTI-LAYER PRINTED WIRING BOARD; 101: COPPER-CLAD LAMINATE; 102, 106, AND 107: WIRING PATTERN; 103: INTERLAYER INSULATING FILM; 104: ORIFICE; 105: SEED LAYER; 108: SOLDER RESIST

TABLE 2

| Item | Example | | | | | | | | | | Comparative Example | | | | | | |
|---|---|---|---|---|---|---|---|---|---|---|---|---|---|---|---|---|---|
| | 1 | 2 | 3 | 4 | 5 | 6 | 7 | 8 | 9 | 10 | 1 | 2 | 3 | 4 | 5 | 6 | 7 |
| A-1 | 100 | 100 | 100 | 100 | 100 | — | — | 100 | 100 | 100 | 100 | 100 | 100 | 100 | 100 | 100 | 100 |
| A-2 | — | — | — | — | — | 100 | — | — | — | — | — | — | — | — | — | — | — |
| A-3 | — | — | — | — | — | — | 100 | — | — | — | — | — | — | — | — | — | — |
| B-1 | 35 | — | — | — | — | — | — | — | — | — | — | — | — | — | — | — | — |
| B-2 | — | — | — | — | — | — | — | 43 | — | — | — | — | — | — | — | — | — |
| B-4 | — | 46 | — | — | — | — | — | — | — | — | — | — | — | — | — | — | — |
| B-5 | — | — | 43 | — | — | — | — | — | — | — | — | — | — | — | — | — | — |
| B-6 | — | — | — | 43 | 25 | 43 | 43 | — | 55 | 65 | — | — | — | 4 | 90 | 73 | — |
| B-7 | — | — | — | — | — | — | — | — | — | — | 75 | — | — | — | — | — | — |
| B'-8 | — | — | — | — | — | — | — | — | — | — | — | 55 | — | — | — | — | — |
| B'-9 | — | — | — | — | — | — | — | — | — | — | — | — | 47 | — | — | — | — |
| B'-10 | — | — | — | — | — | — | — | — | — | — | — | — | — | — | — | — | 43 |
| C-1 | 7 | 7 | 7 | 7 | 7 | 7 | 7 | 7 | 7 | 7 | 7 | 7 | 7 | 7 | 7 | 7 | 7 |
| D-1 | 100 | 100 | 100 | 100 | 100 | 100 | 100 | 100 | 100 | 100 | 100 | 100 | 100 | 100 | 100 | 100 | 100 |
| F-1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| Exposure dose (mJ/cm$^2$) | 800 | 700 | 350 | 400 | 500 | 400 | 400 | 800 | 350 | 400 | 950 | 950 | 950 | 950 | 950 | 500 | 950 |
| Minimum resolution (μm) | 7 | 9 | 6 | 5 | 6 | 5 | 5 | 9 | 6 | 7 | >30 | >30 | >30 | >30 | >30 | 11 | 14 |
| Tg (° C.) | 123 | 93 | 125 | 127 | 120 | 148 | 155 | 113 | 129 | 128 | —*1 | —*1 | —*1 | —*1 | —*1 | 130 | 158 |

*[1]Incapable of resin pattern formation, or incapable of measurement due to brittle cured film.

The components described in Table 2 are as follows.

A-2: cresol novolac resin (made by Asahi Organic Chemicals Industry Co., Ltd., trade name: EP4050G)

A-3: cresol novolac resin (made by Asahi Organic Chemicals Industry Co., Ltd., trade name: EP4020G)

C-1: triaryl sulfonium salt (made by San-Apro Ltd., trade name: CPI-101A)

F-1: 9,10-dibutoxyanthracene (made by Kawasaki Kasei Chemicals Ltd., trade name: DBA)

The invention claimed is:

1. A photosensitive resin composition comprising:
   a component (A): a novolac resin that is a condensation product of phenol and aldehyde, wherein the phenol is at least one selected from the group consisting of phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, and β-naphthol, and wherein the aldehyde is at least one selected from the group consisting of formaldehyde, paraformaldehyde, acetaldehyde, and benzaldehyde;

a component (B): an aliphatic or alicyclic epoxy compound having two or more oxirane rings, wherein the component (B) has two or more glycidyl ether groups;

a component (C): a photosensitive acid generator selected from the group consisting of an iodonium salt, a triarylsulfonium salt, a phosphonium salt, a diazonium salt, a pyridinium salt, a diazoketone compound, a sulfone compound, a sulfonimide compound, and a diazomethane compound; and a component (D): a solvent;

wherein the photosensitive resin composition comprises 25 to 65 parts by mass of the component (B) relative to 100 parts by mass of the component (A).

2. The photosensitive resin composition according to claim 1, wherein the component (B) has three or more glycidyl ether groups.

3. A photosensitive film comprising:
a substrate; and
a photosensitive layer of the photosensitive resin composition according to claim 2 formed on the substrate.

4. A cured product of the photosensitive resin composition according to claim 2.

5. A solder resist comprising a cured product of the photosensitive resin composition according to claim 2.

6. An interlayer insulating film comprising a cured product of the photosensitive resin composition according to claim 2.

7. A photosensitive film comprising:
a substrate; and
a photosensitive layer of the photosensitive resin composition according to claim 1 formed on the substrate.

8. A method for forming a resist pattern, comprising:
a step of forming the photosensitive layer of the photosensitive film according to claim 7 on a substrate;
a step of exposing the photosensitive layer to an active ray in order to form a predetermined pattern and performing a post-exposure heat-treatment; and
a step of developing the photosensitive layer after heat-treatment and heat-treating the obtained resin pattern.

9. A cured product of the photosensitive resin composition according to claim 1.

10. A solder resist comprising a cured product of the photosensitive resin composition according to claim 1.

11. An interlayer insulating film comprising a cured product of the photosensitive resin composition according to claim 1.

12. A method for forming a resist pattern, comprising:
a step of applying the photosensitive resin composition according to claim 1 onto a substrate and drying the applied photosensitive resin composition so as to form a photosensitive layer;
a step of exposing the photosensitive layer to an active ray in order to form a predetermined pattern and performing a heat-treatment after exposure; and
a step of developing the photosensitive layer after heat-treatment and heat-treating the obtained resin pattern.

* * * * *